United States Patent
Yen et al.

(10) Patent No.: US 8,504,977 B1
(45) Date of Patent: Aug. 6, 2013

(54) ELECTRONIC DEVICE AND METHOD FOR GENERATING ELECTRICAL RULE FILE FOR CIRCUIT BOARD

(71) Applicant: Hon Hai Precision Industry Co., Ltd., New Taipei (TW)

(72) Inventors: Shin-Ting Yen, New Taipei (TW); Chun-Neng Liao, New Taipei (TW); Cheng-Hsien Lee, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/779,775

(22) Filed: Feb. 28, 2013

(30) Foreign Application Priority Data

Mar. 8, 2012 (TW) .............................. 101107815 A

(51) Int. Cl.
*G06F 17/50* (2006.01)
(52) U.S. Cl.
USPC ........... 716/137; 716/106; 716/110; 716/111; 716/126; 716/130

(58) Field of Classification Search
USPC ................. 716/102, 106–115, 126–130, 137, 716/139
See application file for complete search history.

(56) References Cited

U.S. PATENT DOCUMENTS

| | | | | |
|---|---|---|---|---|
| 7,793,249 | B1 * | 9/2010 | Wadland et al. | 716/129 |
| 8,060,849 | B2 * | 11/2011 | He et al. | 716/126 |
| 2013/0125084 | A1 * | 5/2013 | Nishio et al. | 716/137 |

* cited by examiner

*Primary Examiner* — Nha Nguyen
(74) *Attorney, Agent, or Firm* — Altis Law Group, Inc.

(57) ABSTRACT

A method of generating electrical rule file for circuit board by using an electronic device. The electronic device acquires a component file, a wiring file, a wiring group file, a first electrical rule file, and a second electrical rule file from a storage device. The electronic device integrates the component file and the wiring file to be an integrated file according to wire names, acquires group names and inserts the group names into the integrated file according to the wire names, acquires first electrical rules and inserts the first electrical rules into the integrated file according to the group names, acquires second electrical rules and inserts the second electrical rules into the integrated file according to the group names, to complete the integrated file, and saves the completed file to the storage device.

6 Claims, 7 Drawing Sheets

| Component name | Pin | Wire |
|---|---|---|
| A1 | A1.1 | L1 |
| A1 | A1.2 | L2 |
| A1 | A1.3 | L3 |
| B1 | B1.1 | L4 |
| B1 | B1.2 | L5 |
| B1 | B1.3 | L6 |

+

| Wire | Wiring group | maximum length value of the wire | minimum length value of the wire | maximum number of vias of the wire | length difference value between a longest wire and a shortest wire in each wiring group |
|---|---|---|---|---|---|
| L1 | | | | | |
| L2 | | | | | |
| L3 | | | | | |
| L4 | | | | | |
| L5 | | | | | |
| L6 | | | | | |

↓

| Component name | Pin | Wire | Wiring group | maximum length value of the wire | minimum length value of the wire | maximum number of vias of the wire | length difference value between a longest wire and a shortest wire in each wiring group |
|---|---|---|---|---|---|---|---|
| A1 | A1.1 | L1 | | | | | |
| A1 | A1.2 | L2 | | | | | |
| A1 | A1.3 | L3 | | | | | |
| B1 | B1.1 | L4 | | | | | |
| B1 | B1.2 | L5 | | | | | |
| B1 | B1.3 | L6 | | | | | |

FIG. 4A

| Component name | Pin | Wire | Wiring group | maximum length value of the wire | minimum length value of the wire | maximum number of vias of the wire | length difference value between a longest wire and a shortest wire in each wiring group |
|---|---|---|---|---|---|---|---|
| A1 | A1.1 | L1 | A | | | | |
| A1 | A1.2 | L2 | A | | | | |
| A1 | A1.3 | L3 | A | | | | |
| B1 | B1.1 | L4 | B | | | | |
| B1 | B1.2 | L5 | B | | | | |
| B1 | B1.3 | L6 | B | | | | |

↑

| Wire | Wiring group |
|---|---|
| L1 | A |
| L2 | A |
| L3 | A |
| L4 | B |
| L5 | B |
| L6 | B |

+

| Component name | Pin | Wire | Wiring group | maximum length value of the wire | minimum length value of the wire | maximum number of vias of the wire | length difference value between a longest wire and a shortest wire in each wiring group |
|---|---|---|---|---|---|---|---|
| A1 | A1.1 | L1 | | | | | |
| A1 | A1.2 | L2 | | | | | |
| A1 | A1.3 | L3 | | | | | |
| B1 | B1.1 | L4 | | | | | |
| B1 | B1.2 | L5 | | | | | |
| B1 | B1.3 | L6 | | | | | |

FIG. 4B

| Component name | Pin | Wire | Wiring group | maximum length value of the wire | minimum length value of the wire | maximum number of vias of the wire | length difference value between a longest wire and a shortest wire in each wiring group |
|---|---|---|---|---|---|---|---|
| A1 | A1.1 | L1 | A | | | | |
| A1 | A1.2 | L2 | A | | | | |
| A1 | A1.3 | L3 | A | | | | |
| B1 | B1.1 | L4 | B | | | | |
| B1 | B1.2 | L5 | B | | | | |
| B1 | B1.3 | L6 | B | | | | |

+

| Wiring group | maximum length value of the wire | minimum length value of the wire | maximum number of vias of the wire |
|---|---|---|---|
| A | 1500 | 400 | 4 |
| B | 5400 | 1500 | 5 |

↓

| Component name | Pin | Wire | Wiring group | maximum length value of the wire | minimum length value of the wire | maximum number of vias of the wire | length difference value between a longest wire and a shortest wire in each wiring group |
|---|---|---|---|---|---|---|---|
| A1 | A1.1 | L1 | A | 1500 | 400 | 4 | |
| A1 | A1.2 | L2 | A | 1500 | 400 | 4 | |
| A1 | A1.3 | L3 | A | 1500 | 400 | 4 | |
| B1 | B1.1 | L4 | B | 5400 | 1500 | 5 | |
| B1 | B1.2 | L5 | B | 5400 | 1500 | 5 | |
| B1 | B1.3 | L6 | B | 5400 | 1500 | 5 | |

FIG. 4C

| Component name | Pin | Wire | Wiring group | maximum length value of the wire | minimum length value of the wire | maximum number of vias of the wire | length difference value between a longest wire and a shortest wire in each wiring group |
|---|---|---|---|---|---|---|---|
| A1 | A1.1 | L1 | A | 1500 | 400 | 4 | |
| | A1.2 | L2 | | 1500 | 400 | 4 | |
| | A1.3 | L3 | | 1500 | 400 | 4 | |
| B1 | B1.1 | L4 | B | 5400 | 1500 | 5 | |
| | B1.2 | L5 | | 5400 | 1500 | 5 | |
| | B1.3 | L6 | | 5400 | 1500 | 5 | |

| Wiring group | length difference value between a longest wire and a shortest wire in each wiring group |
|---|---|
| A | 50 |
| B | 50 |

↑

+

| Component name | Pin | Wire | Wiring group | maximum length value of the wire | minimum length value of the wire | maximum number of vias of the wire | length difference value between a longest wire and a shortest wire in each wiring group |
|---|---|---|---|---|---|---|---|
| A1 | A1.1 | L1 | A | 1500 | 400 | 4 | 50 |
| | A1.2 | L2 | | 1500 | 400 | 4 | |
| | A1.3 | L3 | | 1500 | 400 | 4 | |
| B1 | B1.1 | L4 | B | 5400 | 1500 | 5 | 50 |
| | B1.2 | L5 | | 5400 | 1500 | 5 | |
| | B1.3 | L6 | | 5400 | 1500 | 5 | |

FIG.4D

ELECTRONIC DEVICE AND METHOD FOR GENERATING ELECTRICAL RULE FILE FOR CIRCUIT BOARD

BACKGROUND

1. Technical Field

The embodiments of the present disclosure relate to circuit design technology, and particularly to an electronic device and a method for generating electrical rule file for circuit board.

2. Description of Related Art

At present, a designer who designs a circuit board, usually designs a circuit diagram of the circuit board by using a computerized drawing application, and then imports the circuit diagram into a wiring application to set electrical rules for components included in the circuit diagram. However, if the circuit diagram is copied to design other circuit boards, the designer needs to set new electrical rules for the circuit diagram.

Though the electrical rules can be set by using the drawing application, however, because the drawing application is not programmed specially for setting electrical rules for circuit diagram, if the designer uses the drawing application to set electrical rules, mistakes may occur and additional cost may be incurred. What is needed, therefore, is an electronic device and a method to set electrical rules for the circuit board.

BRIEF DESCRIPTION OF THE DRAWINGS

FIGS. 4A-4D are examples of generating electrical rule file for the circuit board.

DETAILED DESCRIPTION

The disclosure is illustrated by way of examples and not by way of limitation in the figures of the accompanying drawings in which like references indicate similar elements. It should be noted that references to "an" or "one" embodiment in this disclosure are not necessarily to the same embodiment, and such references mean at least one.

In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
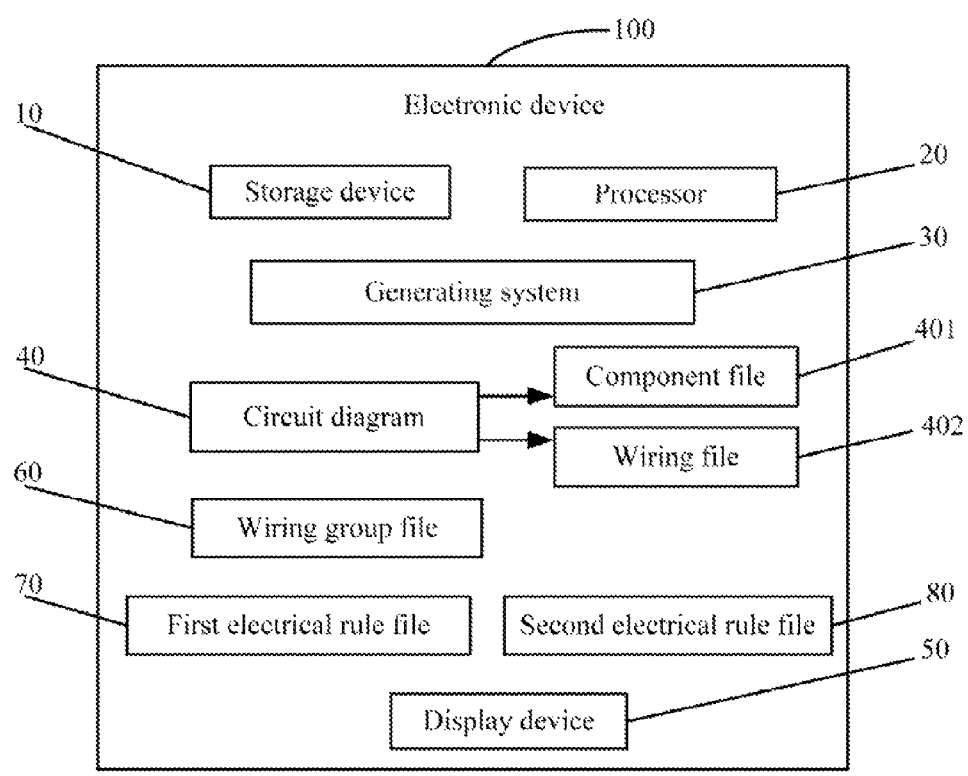
FIG. 1 is one embodiment of a block diagram of an electronic device including a generating system.

FIG. 1 is one embodiment of a block diagram of an electronic device 100. The electronic device 100 includes a storage device 10, at least one processor 20, a generating system 30, and a display device 50. The electronic device 100 may be a computer, a server, or other suitable electronic device that has data processing functions.

The generating system 30 is used to automatically generate electrical rule file for components included in a circuit diagram 40 of a circuit board. Before generating electrical rule file for the components, the generating system 30 executes a computerized drawing application based on the circuit diagram 40 to generate a component file 401 and a wiring file 402.

The component file 401 records components information, pins information, and wires information of the circuit board. The wiring file 402 records a menu of group names and electrical rules of the components. In some embodiments, the wiring file 402 is not a completed file as the menu provides information in columns and rows and one or more columns may be devoid of any information or data and these columns are called blank columns, names of the one or more columns may be predetermined. Corresponding data in other files is inserted into the blank columns. A detailed description will be provided below. The component file 401 and the wiring file 402 are correlated using wire names.

The generating system 30 creates a wiring group file 60 to record a group name of each wiring group. In the wiring group file 60, the generating system 30 groups all the wires according to wire properties and assigns a group name for each wiring group. For example, the generating system 30 classifies wires L1, L2, and L3 in a first wiring group, as the wires L1, L2, and L3 belong to peripheral component interconnect (PCI) transmission lines, the generating system 30 assigns "A" as the group name of the first wiring group.

For another example, the generating system 30 classifies wires L4, L5, and L6 in a second wiring group as the wires L4, L5, and L6 belong to direct media interface (DMI) transmission lines, the generating system 30 assigns "B" as the group name of the second wiring group.

The electrical rules of the circuit board may include, but are not limited to design specification of each component, circuit layers on which the component formed, wiring modes and wiring directions of each wire, wiring spacings between two wires, a maximum length value and a minimum length value of a wire in each wiring group, maximum number of vias of each wire, and length difference value between a longest wire and a shortest wire in each wiring group.

In this embodiment, the electrical rules of the circuit board include the maximum length value and the minimum length value of the wire in each wiring group, the maximum number of vias of the wire in each wiring group, and the length difference value between the longest wire and the shortest wire in each wiring group.

In this embodiment, the generating system 30 creates a first electrical rule file 70 to record first electrical rules of each wiring group. The first electrical rules may include, but are not limited to a maximum length value and a minimum length value of each wire in each wiring group, and a maximum number of vias of each wire in each wiring group.

For example, the generating system 30 sets the maximum length value of each wire in the group "A" to be "1500 mils", sets the minimum length value of each wire in the group "A" to be "400 mils", and sets the maximum number of vias of each wire in the group "A" to be "4", according to a design requirement of the circuit board.

In this embodiment, the generating system 30 further creates a second electrical rule file 80 to record second electrical rules of each wiring group. The second electrical rules may include, but are not limited to the length difference value between the longest wire and the shortest wire in each wiring group. For example, the generating system 30 sets the length difference value between the longest wire and the shortest wire in the group "A" to be "50 mils", according to the design requirement of the circuit board.

The first electrical rule file 70 and the second electrical rule file 80 are not correlated with the components included in the components file 401. The generating system 30 saves the component file 401, the wiring file 402, the wiring group file 60, the first electrical rule file 70 and the second electrical rule file 80 into the storage device 10. The display device 50 is used to display files that are stored in the storage device 10.

Figure 2:
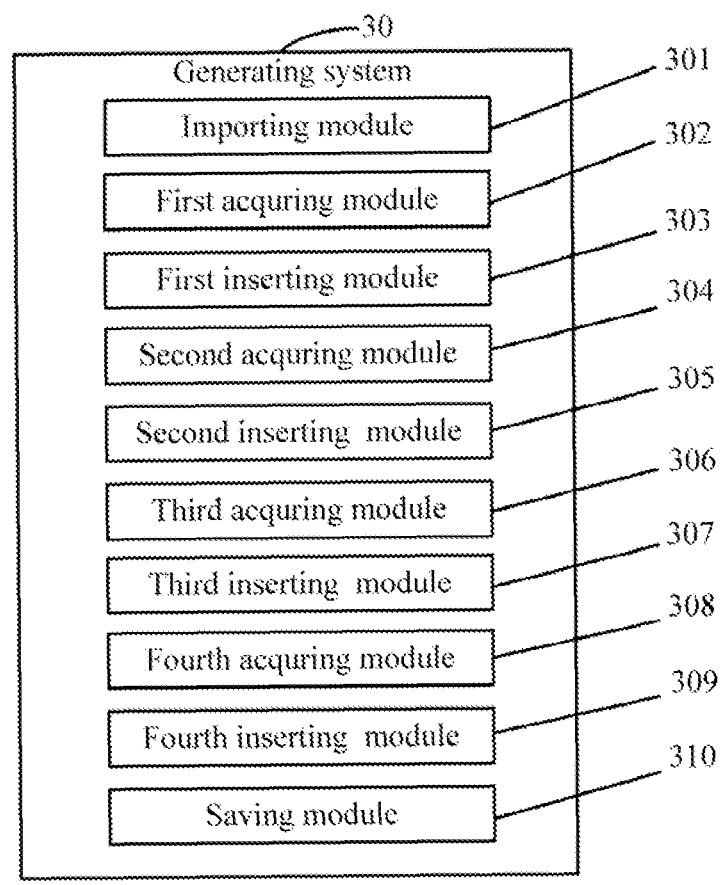
FIG. 2 is one embodiment of function modules of the generating system in FIG. 1.

As shown in FIG. 2, the generating system 30 includes an importing module 301, a first acquiring module 302, a first inserting module 303, a second acquiring module 304, a second inserting module 305, a third acquiring module 306, a third inserting module 307, a fourth acquiring module 308, a fourth inserting module 309, and a saving module 310.

The modules 301-310 may include computerized code in the form of one or more programs that are stored in the storage device 10. The computerized code includes instructions to be processed by the processor 20 to provide the aforementioned functions of the generating system 30. A detailed description of the functions of the modules 301-310 are follows.

The importing module 301 imports a plurality of files from the storage device 10. The imported files include the component file 401, the wiring file 402, the wiring group file 60, the first electrical rule file 70, and the second electrical rule file 80.

The component file 401 records components information, pins information, and wires information of the circuit board. The wiring file 402 records a menu of group names and electrical rules of the components. In some embodiments, the wiring file 402 is not a completed file as the menu provides one or more blank columns, names of the one or more column may be predetermined. The component file 401 and the wiring file 402 are correlated using wire names.

The first acquiring module 302 acquires the menus of group names and electrical rules of the components from the wiring file 402.

The first inserting module 303 inserts the obtained menus into the component file 401 according to the wire names to generate an integrated file. As shown in FIG. 4A, the integrated file includes components information, pins information, wires information, and menus of group names and electrical rules. The integrated file includes content of the component file 401 and the wiring file 402. In some embodiments, the integrated file is not a completed file as the menu provides one or more blank columns.

The second acquiring module 304 acquires group names of the wires from the wiring group file 60.

The second inserting module 305 inserts the group names into the integrated file according to the wire names. As shown in FIG. 4B, the second inserting module 305 inserts the group names "A" into the integrated file according to the wire names L1, L2, and L3. The second inserting module 305 further inserts the group names "B" into the integrated file according to the wire names L4, L5, and L6.

The third acquiring module 306 acquires the first electrical rules of the components, from the first electrical rule file 70 according to the group names.

The third inserting module 307 inserts the first electrical rules into the integrated file according to the group names. As shown in FIG. 4C, the third inserting module 307 inserts the maximum length value "1500 mils", the minimum length value "400 mils", and the maximum number of vias of the wire "4" in the group "A".

The fourth acquiring module 308 acquires the second electrical rules of the components, from the second electrical rule file 80 according to the group names.

The fourth inserting module 309 inserts the second electrical rules into the integrated file according to the group names. As shown in FIG. 4D, the inserting module 309 respectively inserts the length difference value "50 mils" into the integrated file according to the group names "A" and "B". Then the integrated file is completed.

The saving module 310 saves the completed integrated file into the storage device 10.

Figure 3:
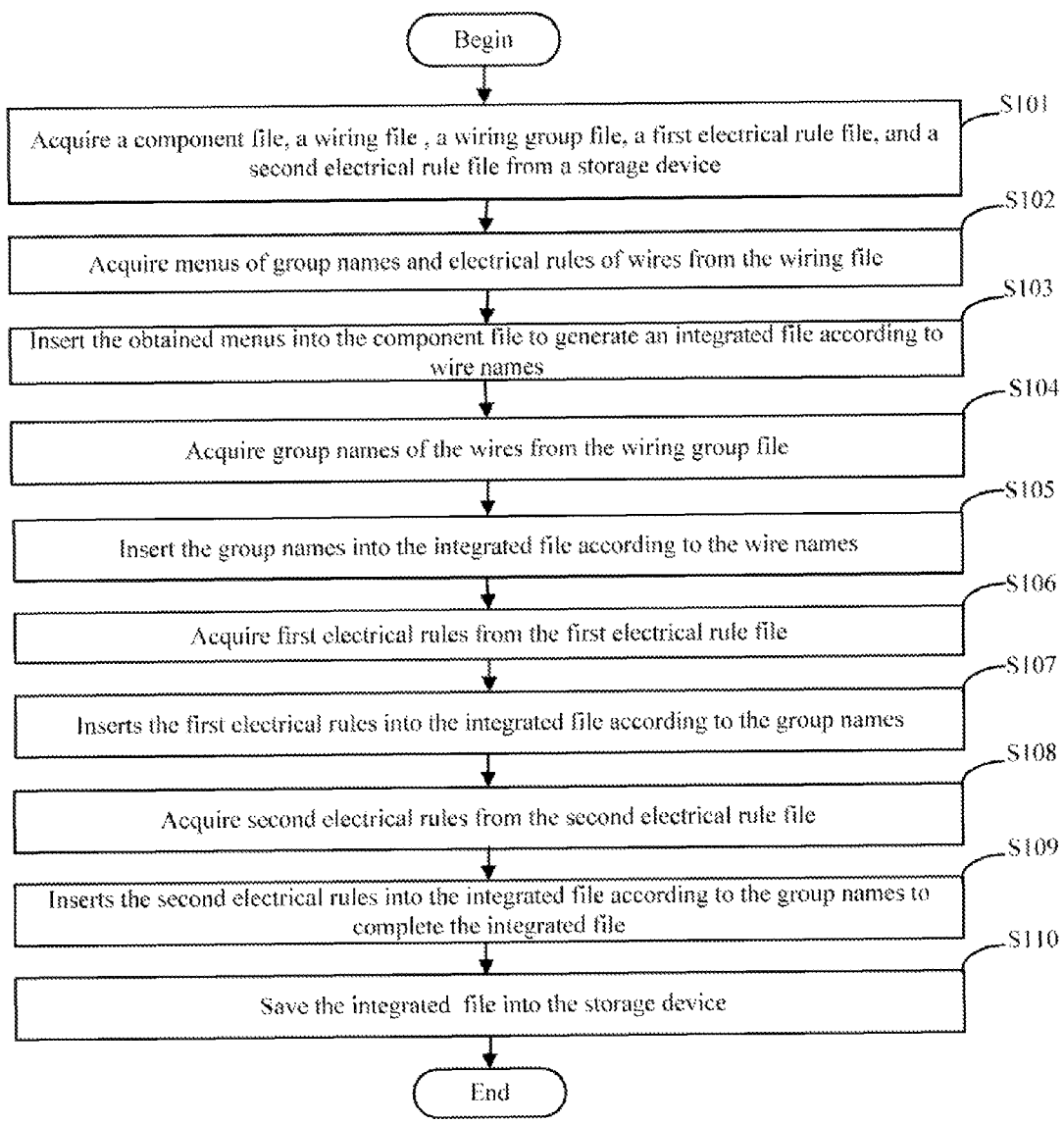
FIG. 3 is a flowchart of one embodiment of a setting method for generating electrical rule file for a circuit board.

FIG. 3 is a flowchart of one embodiment of a setting method for generating electrical rule file for the circuit board. Depending on the embodiment, additional steps may be added, others removed, and the ordering of the steps may be changed.

In step S101, the importing module 301 imports a plurality of files from the storage device 10. The imported files include the component file 401, the wiring file 402, the wiring group file 60, the first electrical rule file 70, and the second electrical rule file 80.

The component file 401 records components information, pins information, and wires information of the circuit board. The wiring file 402 records a menu of group names and electrical rules of the components. In some embodiments, the wiring file 402 is not a completed file as the menu provides one or more blank columns, names of the one or more column may be predetermined. The component file 401 and the wiring file 402 are correlated using wire names.

In step S102, the first acquiring module 302 acquires the menus of group names and electrical rules of the components from the wiring file 402.

In step S103, the first inserting module 303 inserts the obtained menus into the component file 401 according to the wire names to generate an integrated file. As shown in FIG. 4A, the integrated file includes components information, pins information, wires information, and menus of group names and electrical rules. The integrated file includes content of the component file 401 and the wiring file 402. In some embodiments, the integrated file is not a completed file as the menu provides one or more blank columns.

In step S104, the second acquiring module 304 acquires group names of the wires from the wiring group file 60.

In step S105, the second inserting module 305 inserts the group names into the integrated file according to the wire names. As shown in FIG. 4B, the second inserting module 305 inserts the group names "A" into the integrated file according to the wire names L1, L2, and L3. The second inserting module 305 further inserts the group names "B" into the integrated file according to the wire names L4, L5, and L6.

In step S106, the third acquiring module 306 acquires the first electrical rules of the components, from the first electrical rule file 70 according to the group names.

In step S107, the third inserting module 307 inserts the first electrical rules into the integrated file according to the group names. As shown in FIG. 4C, the third inserting module 307 inserts the maximum length value "1500 mils", the minimum length value "400 mils", and the maximum number of vias of the wire "4" in the group "A".

In step S108, the fourth acquiring module 308 acquires the second electrical rules of the components, from the second electrical rule file 80 according to the group names.

In step S109, the fourth inserting module 309 inserts the second electrical rules into the integrated file according to the group names. As shown in FIG. 4D, the inserting module 309 respectively inserts the length difference value "50 mils" into the integrated file according to the group names "A" and "B". Then the integrated file is completed, i.e., the electrical rule file for the circuit board is generated.

In step S110, the saving module 310 saves the completed integrated file into the storage device 10.

A designer who is responsible for wiring of the circuit board could directly execute a wiring application based on the completed integrated file, and no need to set electrical rule for the components using the wiring application. Even the circuit diagram 40 is copied to design other circuit boards, the generating system 30 can generate electrical rule file for the other circuit boards automatically.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. An electronic device, comprising:
a storage device;
at least one processor; and
one or more modules that are stored in the storage device and are executed by the at least one processor, the one or more modules comprising:
an importing module that imports a plurality of files of a circuit board from the storage device, the imported files comprising a component file that records components information, pins information, and wires information of the circuit board, a wiring file that records menus of group names and electrical rules of the components, a wiring group file that records a group name of each wiring group, a first electrical rule file that records first electrical rules of each wiring group; and a second electrical rule file that records second electrical rules of each wiring group, the component file and the wiring file being correlated using wire names;
a first acquiring module that acquires the menus of group names and electrical rules of the components from the wiring file;
a first inserting module that inserts the obtained menus into the component file according to the wire names to generate an integrated file;
a second acquiring module that acquires group names of the wires from the wiring group file;
a second inserting module that inserts the group names into the integrated file according to the wire names;
a third acquiring module that acquires first electrical rules of the components from the first electrical rule file according to the group names;
a third inserting module that inserts the first electrical rules into the integrated file according to the group names;
a fourth acquiring module that acquires second electrical rules of the components from the second electrical rule file according to the group name;
a fourth inserting module that inserts the second electrical rules into the integrated file according to the group names;
a saving module that saves the integrated file into the storage device; and
wherein the first electrical rules comprise maximum length value and minimum length value of a wire in each wiring group, and a maximum number of vias of the wire, the second electrical rules comprise length difference value between a longest wire and a shortest wire in each wiring group.

2. The electronic device of claim 1, wherein the component file and the wiring file are generated by executing a drawing application based on a circuit diagram of the circuit board.

3. A non-transitory medium storing a set of instructions, the set of instructions being executed by a processor of an electronic device to perform a method of generating electrical rule file for circuit board, the method comprising:
importing a plurality of files of a circuit board from the storage device, the imported files comprising a component file that records components information, pins information, and wires information of the circuit board, a wiring file that records menus of group names and electrical rules of the components, a wiring group file that records a group name of each wiring group, a first electrical rule file that records first electrical rules of each wiring group; and a second electrical rule file that records second electrical rules of each wiring group, the component file and the wiring file being correlated using wire names;
acquiring the menus of group names and electrical rules of the components from the wiring file;
inserting the obtained menus into the component file according to the wire names to generate an integrated file;
acquiring group names of the wires from the wiring group file;
inserting the group names into the integrated file according to the wire names;
acquiring first electrical rules of the components from the first electrical rule file according to the group names;
inserting the first electrical rules into the integrated file according to the group names;
acquiring second electrical rules of the components from the second electrical rule file according to the group name;
inserting the second electrical rules into the integrated file according to the group names;
saving the integrated file into the storage device; and
wherein the first electrical rules comprise maximum length value and minimum length value of a wire in each wiring group, and a maximum number of vias of the wire, the second electrical rules comprise length difference value between a longest wire and a shortest wire in each wiring group.

4. The medium of claim 3, wherein the component file and the wiring file are generated by executing a drawing application based on a circuit diagram of the circuit board.

5. A method of generating electrical rule file for circuit board by using an electronic device, the electronic device comprises a storage device and at least one processor, the method comprising:
importing a plurality of files of a circuit board from the storage device, the imported files comprising a component file that records components information, pins information, and wires information of the circuit board, a wiring file that records menus of group names and electrical rules of the components, a wiring group file that records a group name of each wiring group, a first electrical rule file that records first electrical rules of each wiring group; and a second electrical rule file that records second electrical rules of each wiring group, the component file and the wiring file being correlated using wire names;
acquiring the menus of group names and electrical rules of the components from the wiring file;
inserting the obtained menus into the component file according to the wire names to generate an integrated file;
acquiring group names of the wires from the wiring group file;
inserting the group names into the integrated file according to the wire names;
acquiring first electrical rules of the components from the first electrical rule file according to the group names;
inserting the first electrical rules into the integrated file according to the group names;

acquiring second electrical rules of the components from the second electrical rule file according to the group name;

inserting the second electrical rules into the integrated file according to the group names;

saving the integrated file into the storage device; and wherein the first electrical rules comprise maximum length value and minimum length value of a wire in each wiring group, and a maximum number of vias of the wire, the second electrical rules comprise length difference value between a longest wire and a shortest wire in each wiring group.

6. The method of claim 5, wherein the component file and the wiring file are generated by executing a drawing application based on a circuit diagram of the circuit board.

* * * * *